(12) United States Patent
Joffe

(10) Patent No.: US 10,243,530 B1
(45) Date of Patent: Mar. 26, 2019

(54) STEPPED ATTENUATION CIRCUIT WITH CONSTANT DECIBEL STEPS

(71) Applicant: ADTRAN, INC., Huntsville, AL (US)

(72) Inventor: Daniel M. Joffe, Owens Crossroads, AL (US)

(73) Assignee: ADTRAN, Inc., Huntsville, AL (US)

( * ) Notice: Subject to any disclaimer, the term of this patent is extended or adjusted under 35 U.S.C. 154(b) by 0 days.

(21) Appl. No.: 15/582,620

(22) Filed: Apr. 29, 2017

(51) Int. Cl.
*H03G 3/00* (2006.01)
*H03G 3/30* (2006.01)
*H03F 3/45* (2006.01)

(52) U.S. Cl.
CPC ............ *H03G 3/30* (2013.01); *H03F 3/45475* (2013.01); *H03F 2203/45206* (2013.01); *H03G 2201/106* (2013.01)

(58) Field of Classification Search
CPC .............. H03G 3/30; H03G 2201/106; H03F 3/45475; H03F 2203/45206
USPC .................................. 330/86, 284; 333/81 R
See application file for complete search history.

(56) References Cited

U.S. PATENT DOCUMENTS

| | | | | |
|---|---|---|---|---|
| 7,843,261 B2 * | 11/2010 | Schaffer | ............... | H03G 1/0088 330/144 |
| 2003/0207675 A1 | 11/2003 | Hughes et al. | | |
| 2005/0168279 A1 | 8/2005 | Behzad | | |
| 2012/0135698 A1 | 5/2012 | Yan et al. | | |
| 2013/0272314 A1 | 10/2013 | Kuipers et al. | | |
| 2016/0079959 A1 | 5/2016 | Joish | | |
| 2016/0344447 A1 | 11/2016 | Schmid | | |

* cited by examiner

*Primary Examiner* — Khanh V Nguyen
*Assistant Examiner* — Khiem D Nguyen
(74) *Attorney, Agent, or Firm* — Maynard Cooper & Gale, P.C.; Jon E. Holland

(57) ABSTRACT

An attenuation circuit with stages having constant dB steps between stages is provided. The attenuation circuit can be configured as a ladder network using resistors having three different values. A first resistor can be connected between the last stage of the attenuation circuit and ground and have a first predetermined resistance. One or more second resistors can be connected in each stage and have a second predetermined resistance based on the first predetermined resistance and the dB step between stages. One or more third resistors can be connected in parallel to the first resistor for the remaining stages and have a third predetermined resistance based on the first predetermined resistance and the dB step between stages.

28 Claims, 5 Drawing Sheets

STEPPED ATTENUATION CIRCUIT WITH CONSTANT DECIBEL STEPS

BACKGROUND

The present application generally relates to a stepped attenuation circuit with constant decibel (dB) steps that can be used in an electronic device, such as an amplifier or attenuator.

Amplifiers or attenuators with equal dB steps of gain or attenuation can be useful in communications devices. Typical implementations of equal dB steps in an amplifier or attenuator can use either: 1) complicated switching arrangements with a few different resistor values; or 2) a simple switching arrangement with many different resistor values.

In one example, a stepped amplifier or attenuator can be made by selecting among N different, two-resistor stages to provide N different gains, which can require 2 N different resistor values and either a 1-pole, N throw switch or a 2-pole, N throw switch. In another example, the stepped amplifier or attenuator can be made by constructing a series or string of N resistors to produce different values of gain or attenuation, which may require N different resistor values and a 1-pole, N throw switch. In a further example, the stepped amplifier or attenuator can be made by constructing a line of pi or T sections switched by double pole, double throw switches. Some common shortcomings of the above-identified configurations are that they require either a complex switching arrangement or many different resistor values.

SUMMARY

The present application generally pertains to an attenuation circuit that can be used in an electronic device such an amplifier or attenuator. The attenuation circuit can have a plurality of stages with constant dB steps between stages. The stages of the attenuation circuit can be selected using a switching arrangement to obtain the desired gain or attenuation from the attenuation circuit depending on how the attenuation circuit is connected in the electronic device. The attenuation circuit can use a ladder network to provide the equal or constant predetermined dB steps between the stages. The ladder network can be formed using resistors having one of three different values. A first resistor can be connected between the last stage and ground and have a first predetermined resistance. One or more second resistors can be connected in each stage and have a second predetermined resistance based on the first predetermined resistance and the predetermined dB step between stages. One or more third resistors can be connected in parallel to the first resistor in the remaining stages (i.e., the stages other than the last stage) and have a third predetermined resistance based on the first predetermined resistance and the predetermined dB step between stages.

One advantage of the present application is that it uses a simple and inexpensive switching arrangement with just three different resistor values to implement constant or equal dB steps of gain or attenuation in any amount.

Other features and advantages of the present application will be apparent from the following more detailed description of the identified embodiments, taken in conjunction with the accompanying drawings which show, by way of example, the principles of the application.

BRIEF DESCRIPTION OF THE DRAWINGS

Wherever possible, the same reference numbers are used throughout the drawings to refer to the same or like parts.

DETAILED DESCRIPTION

The present application generally pertains to an attenuation circuit for an electronic device that can provide different levels of attenuation. The different levels of attenuation can be obtained by selecting different stages of the attenuation circuit. The attenuation circuit is configured such that there is a constant or equal dB step between the stages of the attenuation circuit. For example, if a 1 dB step was selected for the attenuation circuit, then each subsequent stage of the attenuation circuit would have 1 additional dB of loss over the prior stage of the attenuation circuit. The attenuation circuit can provide the equal steps between stages using resistors having only three different values. Each of the stages of the attenuation circuit can have a pair of resistors connected in an "L" configuration with one resistor (referred to herein as the stage's "horizontal resistor") connected to (1) another resistor (referred to herein as the stage's "vertical resistor") and (2) the tap for the stage located between the resistors. The "horizontal" resistor for each stage can have the same resistance value. The "vertical" resistor for each stage except the "final" stage can also have the same resistance value (which is different from the resistance value for the "horizontal" resistor). In the "final" stage of the attenuation circuit, the "vertical" resistor is replaced by a resistor, referred to herein as the "base resistor," having a resistance value different from the "horizontal" resistors and the "vertical" resistors. The "base" resistor value is used in conjunction with the desired dB step between stages to determine the "horizontal" and "vertical" resistor values.

Figure 1:
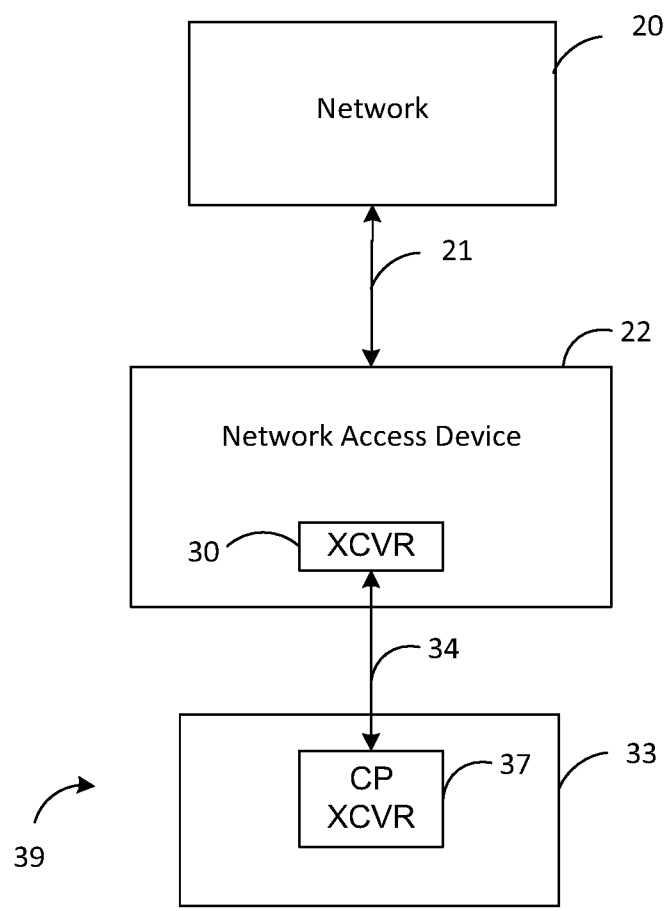
FIG. 1 is a block diagram showing an embodiment of a communication network.

FIG. 1 depicts an embodiment of a telecommunication system 39 for communicating data between at least one customer premises 33 and a telecommunication network 20. Examples of networks and telecommunication systems that can be used with the present application are described in commonly-assigned U.S. Patent Application Publication No. 2013/0272314, entitled "Systems and Methods for Avoiding Crosstalk" and published on Oct. 17, 2013, which is incorporated herein by reference.

As shown by FIG. 1, the system 39 includes a telecommunication network 20, such as a public switched telephone network (PSTN), connected to a network access device (NAD) 22 via a connection 21. The NAD 22 can include a transceiver (XCVR) 30 for transmitting data received from the telecommunication network 20 to at least one customer premises (CP) 33. In the embodiment shown by FIG. 1, the XCVR 30 is coupled to at least one CP XCVR 37 or other communication device via a subscriber line 34 (e.g., a drop connection). The subscriber line 34 may include at least one twisted wire pair, but other types of subscriber lines (e.g., optical fiber) are possible in other embodiments. While the NAD 22 in FIG. 1 only shows one XCVR 30, the NAD 22 can include additional XCVRs 30 connected to other CP XCVRs 37 in other embodiments. The NAD 22 also includes other components (in addition to XCVR 30), as is described by U.S. Patent Application Publication No. 2013/

0272314, that can be used to facilitate communications, both upstream and downstream, between the CP 33 and the telecommunication network 20. In one embodiment, the NAD 22 may reside at a central office of a telecommunication network or an intermediate point between a central office and the CP 33.

Figure 2:
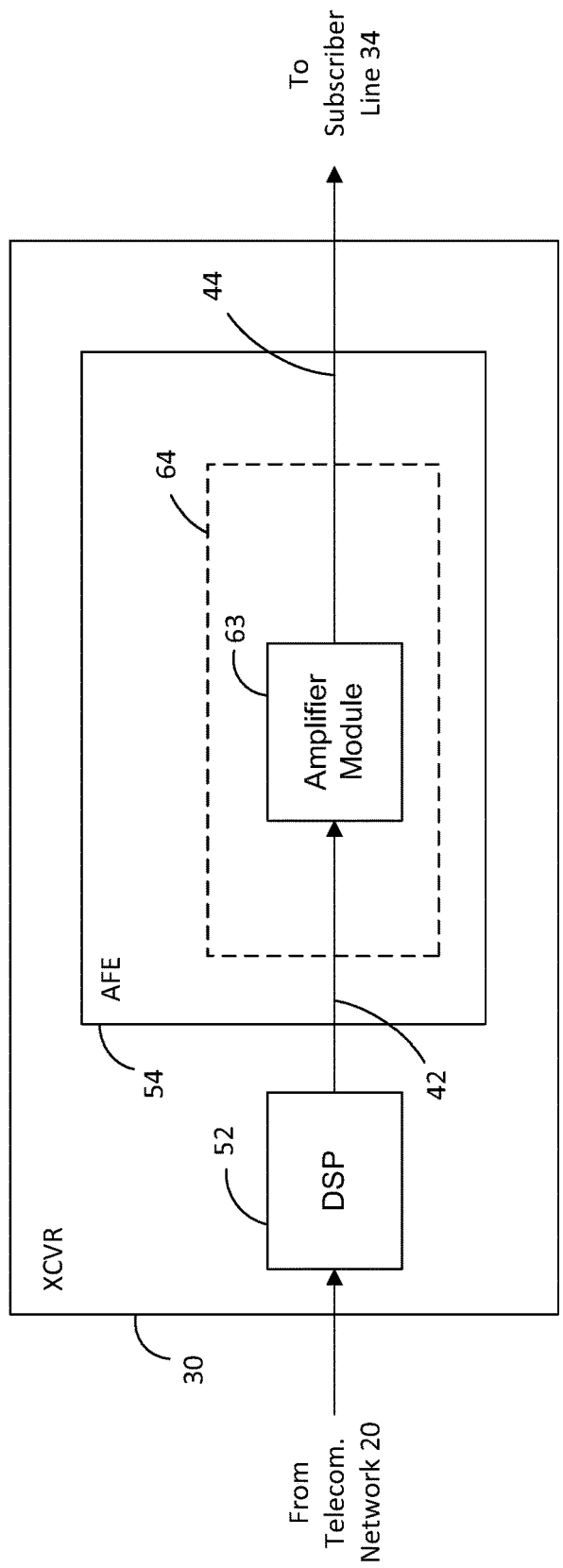
FIG. 2 is a block diagram showing an embodiment of a transceiver with an amplifier module.

FIG. 2 shows an embodiment of an XCVR 30 used for providing downstream communications to the CP XCVR 37. It is to be understood that the XCVR 30 shown in FIG. 2 may include additional equipment and/or components to perform additional functions and operations that are not shown in FIG. 2, e.g., the processing of upstream communications. The XCVR 30 has a digital signal processor (DSP) 52 that receives and processes a data signal from the telecommunication network 20. The DSP 52 provides the processed data signal to an analog front end (AFE) module 54 that transmits the data signal across the subscriber line 34 to the CP XCVR 37. The AFE module 54 has a driver circuit 64 to amplify the data signal from the DSP 52 and transmit the amplified signal to the CP XCVR 37. Note that in one embodiment all of the components of the XCVR 30 can reside on a printed circuit board (PCB), referred to as a "line card." In other embodiments, other configurations of the XCVR 30 are possible.

The driver circuit 64 has an input connection 42 that receives the data signal from the DSP 52 and an output connection 44 connected to the subscriber line 34. The input connection 42 provides the data signal from the DSP 52 to an amplifier module 63 and the output connection 44 provides the amplified output signal from the amplifier module 63 to the subscriber line 34.

Figure 3:
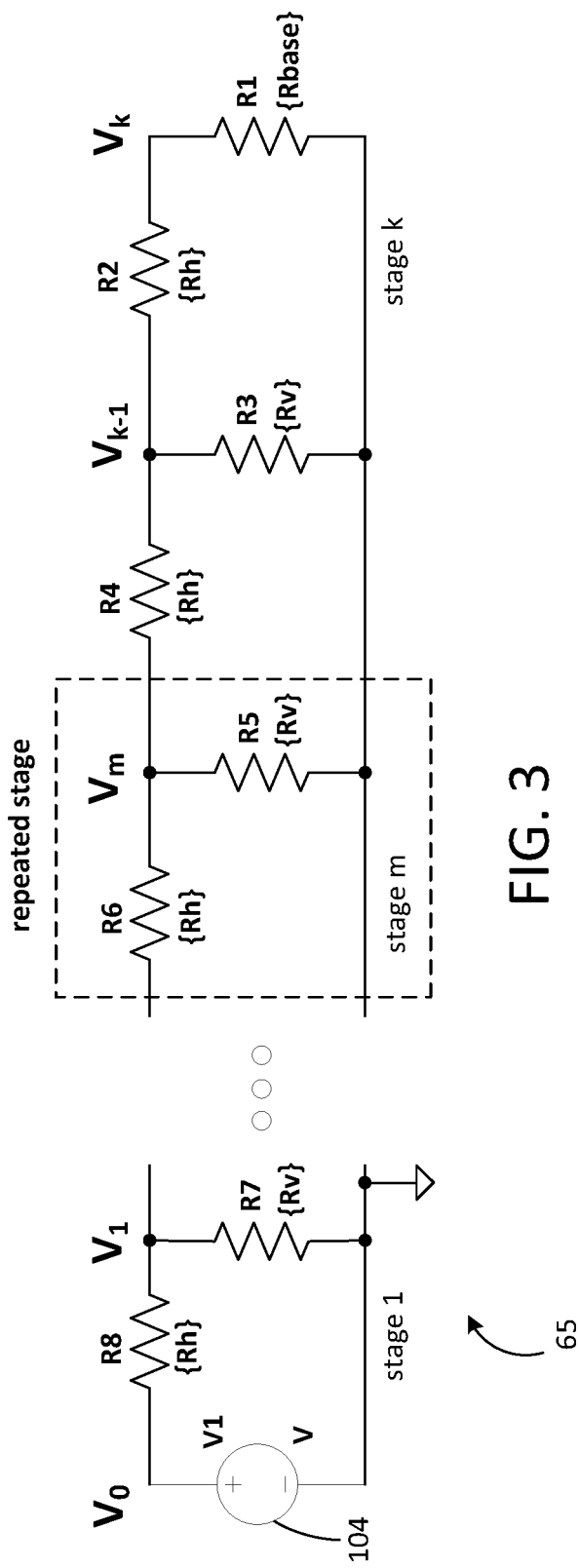
FIG. 3 is a circuit diagram showing an embodiment of an attenuation circuit.
Figure 4:
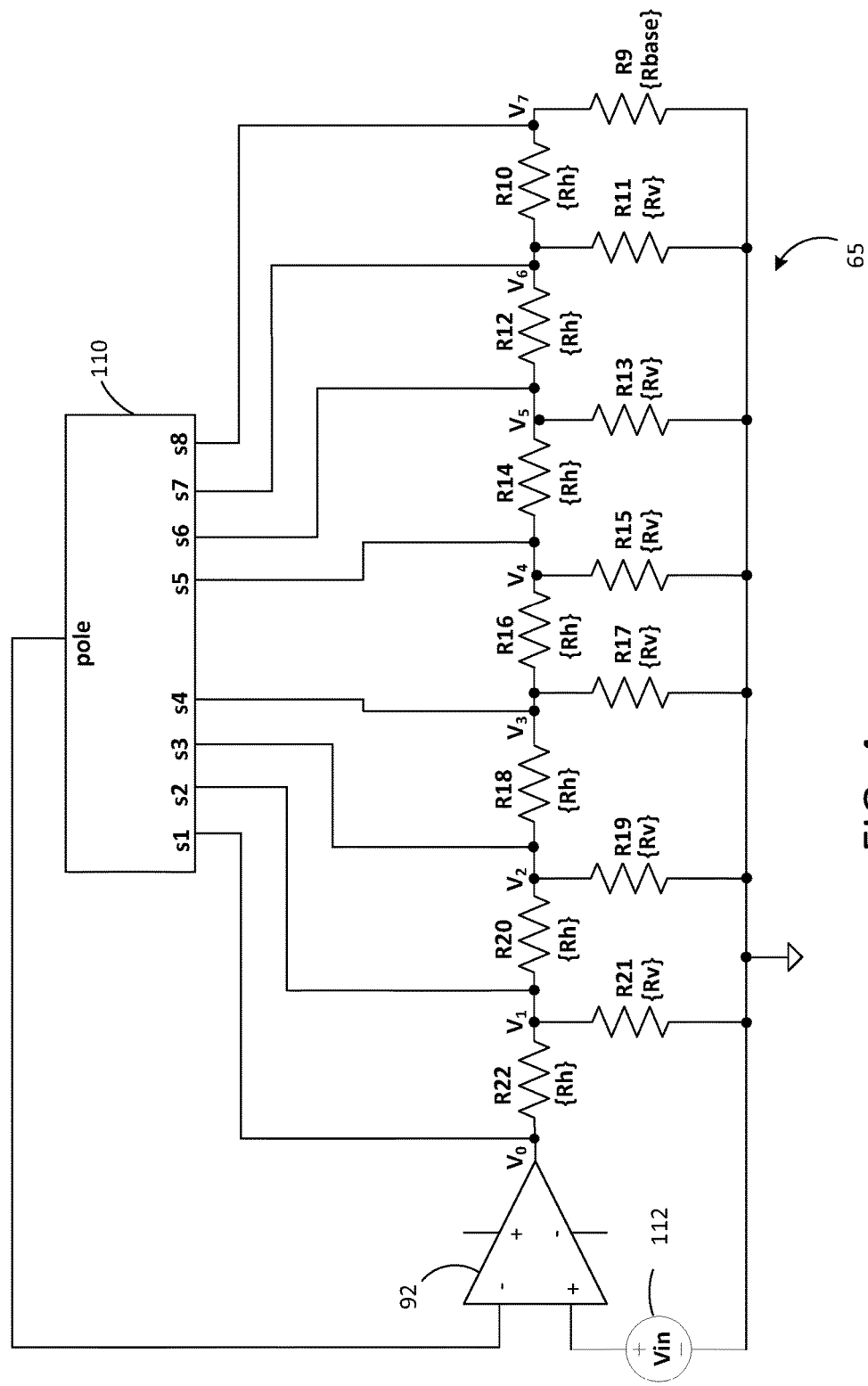
FIG. 4 is a circuit diagram showing an embodiment of an amplifier incorporating the attenuation circuit of FIG. 3.

FIG. 3 shows an embodiment of an attenuation circuit 65 that may be used in one or more of NAD 22, XCVR 30, amplifier module 63, AFE module 54 or CP XCVR 37. The attenuation circuit 65 can be connected to a voltage source 104 (shown schematically in FIG. 3) such as the output of an operational amplifier (op-amp) as shown in FIG. 4. The attenuation circuit 65 can include a plurality of stages (1 to k) and a plurality of voltage steps ($V_0$ to $V_k$). The plurality of voltage steps ($V_0$ to $V_k$) can have a constant or equal predetermined dB step or voltage ratio, e.g., 3 dB step or $\sqrt{2}$ (square root of 2) voltage ratio, between voltage steps. In other words, the voltages at neighboring voltages steps can either be above or below the voltage at a selected voltage step by the predetermined dB step or voltage ratio. For example, if a voltage step has a corresponding voltage of 2V and predetermined voltage ratio is $\sqrt{2}$ (corresponding to a predetermined dB step of 3 dB), then the neighboring voltage steps would have corresponding voltages of $\sqrt{2}$ V and $2 \cdot \sqrt{2}$ V. In one embodiment, the number of stages (k) can be 7 and the number of voltage steps (k+1) can be 8 as shown in FIG. 4. However, in other embodiments more or less than 7 stages and more or less than 8 voltage steps can be implemented in the attenuation circuit.

The stages of the attenuation circuit 65 can have two resistors arranged in an "L" configuration with a tap for the voltage step located between the resistors. In an "L" configuration, the two resistors can be connected to a common node, with one resistor being connected between the common node and a ground connection and the other resistor connected between the common node and an input/output connection. Stages 1 through k−1 of the attenuation circuit 65 can have an identical or repeated configuration as exemplified by stage m of FIG. 3. In stage m, a resistor R6 and a resistor R5 can be connected to the tap for voltage step $V_m$. Resistor R6 can also be connected to the tap for the prior voltage step (not shown in FIG. 3). Resistor R5 can also be connected to ground. For each of the stages 1 through k−1, the R6 resistor (as shown in stage m) has the same resistance value Rh. Similarly, for each of the stages 1 through k−1, the R5 resistor (as shown in stage m) has the same resistance value Rv. By using the same resistance values of Rh and Rv in each of the stages 1 through k−1, the attenuation circuit 65 can provide an equal voltage ratio of dB step between the stages.

Stage k (also referred to as the "final" stage) of the attenuation circuit can have a resistor R2 and a resistor R1 connected to the tap for voltage step $V_k$. Resistor R2 can also be connected to the tap for the prior voltage step $V_{k-1}$. Resistor R1 can also be connected to ground. Resistor R2 has the same resistance value (Rh) as the R6 resistor (as shown in stage m) of the other stages of the attenuation circuit. Resistor R1 can have a resistance value (Rbase) that is different from the resistance value of the Rv of resistor R5 (as shown in stage m) of the other stages. The resistance value for Rbase can be selected by a user to obtain a desired characteristic for the attenuation circuit 65. Once the resistance value for Rbase is selected, the resistance values for Rh and Rv can be determined based on the Rbase resistance value and the desired voltage ratio or dB step between stages as discussed in greater detail below.

FIG. 4 shows an embodiment of an amplifier incorporating the attenuation circuit 65 of FIG. 3. The attenuation circuit 65 can be connected to the output of an operational amplifier (op-amp) 92. As shown in FIG. 4, the attenuation circuit 65 has 7 stages and 8 taps for voltage steps $V_0$-$V_7$. Each tap for the voltage steps $V_0$-$V_7$ can be connected to a corresponding connection point s1-s8 of a switch 110. The switch 110 is also connected to the inverting input of the op-amp 92 to provide a negative feedback signal to op-amp 92 from attenuation circuit 65 to control the gain applied to the op-amp 92. The non-inverting input of the op-amp 92 can be connected to a voltage source 112 (shown schematically in FIG. 4) such as the output of the DSP 52 from FIG. 2. The switch 110 can be configured to permit one selected connection point s1-s8 to connect to the inverting input of the op-amp 92. The remaining connection points s1-s8 that were not selected can be disabled (or not connected to the inverting input of the op-amp 92) thereby permitting only one voltage step $V_0$-$V_7$ to be selected from the attenuation circuit 65 and provided to the op-amp 92. By selecting a particular voltage step $V_0$-$V_7$ of the attenuation circuit 65, a desired gain from the amplifier can be obtained.

The attenuator circuit 65 can provide an equal or constant dB step or voltage ratio between adjacent voltage steps $V_0$-$V_7$. To obtain the equal steps in voltage, resistors R10, R12, R14, R16, R18, R20 and R22 can have the same predetermined resistance value (Rh) and resistors R11, R13, R15, R17, R19 and R21 can have the same predetermined resistance value Rv, which is different from the predetermined resistance value Rh. Resistor R9 can have a predetermined resistance value Rbase, which value can be used to determine the resistance values Rh and Rv.

Figure 5:
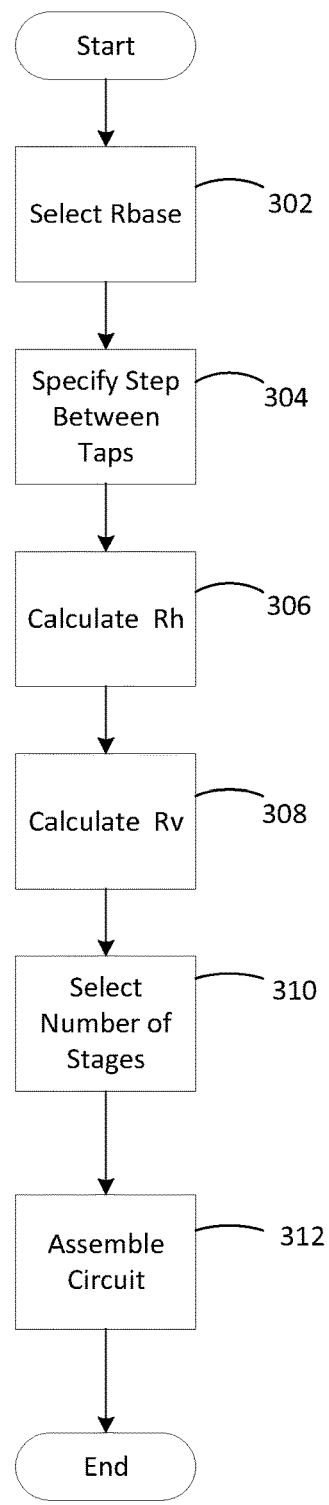
FIG. 5 shows an embodiment of a process for configuring the attenuation circuit of FIG. 3.

FIG. 5 shows an embodiment of a process for configuring the attenuation circuit. The process begins by selecting the resistance value for Rbase (step 302). The selection of Rbase can be made based on a tradeoff between power dissipation, noise and bandwidth. For example, the selection of a lower resistance value for Rbase can provide high bandwidth and low noise, but would have high power dissipation. Once the resistance value for Rbase is selected, the desired dB step or voltage ratio between taps is specified (step 304). The specified dB step (dBL) would correspond to either a dB loss or dB gain between the taps depending on how the attenuation circuit 65 is implemented.

After the selection of the dB step (dBL), the resistance value Rh can be calculated (step 306) and the resistance value Rv can be calculated (step 308) for the stages of the attenuation circuit 65. Equations 1 and 2 show the calculation of Rh and Rv from the value of Rbase and the selected dB step (dBL).

$$Rh = Rbase \cdot \left[10^{\frac{dBL}{20}} - 1\right] \quad (1)$$

$$Rv = Rbase \cdot \left[1 + \frac{1}{10^{\frac{dBL}{20}} - 1}\right] \quad (2)$$

Next, the number of stages (k) for the attenuation circuit 65 can be selected (step 310). In one embodiment, the number of stages (k) can be selected to provide the desired number of voltage steps, which can be one greater (k+1) than the number of stages (k). The attenuation circuit 65 can then be assembled (step 312) with the selected number of stages (k). In assembling the attenuation circuit 65, the attenuation circuit can use k resistors having a resistance value of Rh, k−1 resistors having a resistance value of Rv, and 1 resistor having a resistance value of Rbase. The final stage can be assembled by connecting the Rbase resistor and an Rh resistor in an "L" configuration. The remaining stages can be assembled by connecting an Rv resistor and an Rh resistor in an "L" configuration and then connecting that stage to the prior stage to form a ladder network. In one embodiment, one or more switches 110 can be connected to the taps of the stages to permit selectability among the taps to obtain the desired gain (if connected in a feedback loop) or loss from the attenuation circuit 65.

In one embodiment of the attenuation circuit 65, the Thevenin impedance (Zth) of all the taps (associated with the voltage steps ($V_0$ to $V_k$)) varies with the tap number. For example, the zeroth tap impedance, i.e., the impedance associated with the tap for voltage step $V_0$, is 0 Ohms. For each subsequent tap, the impedance (Zth) rises, but is always less than the value set forth in equation 3.

$$Zth < Rbase \cdot \left[\frac{10^{\frac{dBL}{20}}}{10^{\frac{dBL}{20}} + 1}\right] \quad (3)$$

Referring back to FIG. 3, the voltage source 104 can see a load impedance (Zload) as defined by equation 4.

$$Zload = Rbase \cdot 10^{\frac{dBL}{20}} \quad (4)$$

The attenuation circuit 65 is described in various embodiments for use within a transceiver 30 of a network access device 22. However, it is possible to use the attenuation circuit 65 in other types of communication devices, such as the NAD 22 or the CP XCVR 37 located at the customer premises 33. In other embodiments, the attenuation circuit 65 can be used in any electronic device requiring fixed stages of attenuation or gain.

Although the figures herein may show a specific order of method steps, the order of the steps may differ from what is depicted. Also, two or more steps may be performed concurrently or with partial concurrence. Variations in step performance can depend on the software and hardware systems chosen and on designer choice. All such variations are within the scope of the application. Software implementations could be accomplished with standard programming techniques, with rule based logic and other logic to accomplish the various connection steps, processing steps, comparison steps and decision steps.

It should be understood that the identified embodiments are offered by way of example only. Other substitutions, modifications, changes and omissions may be made in the design, operating conditions and arrangement of the embodiments without departing from the scope of the present application. Accordingly, the present application is not limited to a particular embodiment, but extends to various modifications that nevertheless fall within the scope of the application. It should also be understood that the phraseology and terminology employed herein is for the purpose of description only and should not be regarded as limiting.

What is claimed is:

1. An attenuation circuit for an electronic device comprising:
    a voltage source (104); and
    a ladder network (65) having a first end (associated with $V_0$) and a second end (associated with $V_k$) opposite the first end ($V_0$), the first end ($V_0$) of the ladder network (65) being connected to the voltage source (104), the ladder network comprising:
        a first stage (stage k) positioned at the second end ($V_k$) of the ladder network (65), the first stage (stage k) comprising a first resistor (R1) connected to a second resistor (R2), wherein the first resistor (R1) has a first resistance value (Rbase) and the second resistor (R2) has a second resistance value (Rh);
        a plurality of second stages (stages 1 to k−1) connected between the first end ($V_0$) of the ladder network (65) and the first stage (stage k), each second stage of the plurality of second stages (stages 1 to k−1) comprising a third resistor (R5) connected to a fourth resistor (R6), wherein the third resistor (R5) has a third resistance value (Rv) and the fourth resistor (R6) has a fourth resistance value (Rh) equal to the second resistance value (Rh); and
        wherein the second resistance value (Rh) is different from the first resistance value (Rbase), the third resistance value (Rv) is different from the first resistance value (Rbase) and the second resistance value (Rh), and wherein the first resistance value (Rbase) is selected to obtain a predetermined characteristic for the attenuation circuit, the predetermined characteristic corresponding to at least one of power dissipation, noise or bandwidth.

2. The attenuation circuit of claim 1, further comprising a plurality of taps, each tap of the plurality of taps corresponding to a voltage step for the attenuation circuit, and wherein the first stage and the plurality of second stages are configured to provide an equal decibel (dB) step between the plurality of taps.

3. The attenuation circuit of claim 2, wherein the first resistor and the second resistor of the first stage are connected to a tap of the plurality of taps and the third resistor and the fourth resistor of each second stage of the plurality of second stages are connected to a corresponding tap of the plurality of taps.

4. The attenuation circuit of claim 3, wherein the second resistor is connected to the corresponding tap of one second stage of the plurality of second stages.

5. The attenuation circuit of claim 1, wherein the third resistor of each second stage of the plurality of second stages is connected in parallel to the first resistor.

6. The attenuation circuit of claim 1, wherein the first resistor and the second resistor of the first stage are connected in an L configuration and the third resistor and the fourth resistor for each second stage of the plurality of second stages are connected in an L configuration.

7. A method for configuring an attenuation circuit (65) having a first stage (stage k) connected to a plurality of second stages (stages 1 to k−1), the first stage (stage k) comprising a first resistor (R1) connected to a second resistor (R2) and each second stage of the plurality of second stages (stages 1 to k−1) comprising a third resistor (R5) connected to a fourth resistor (R6), the method comprising:
selecting a first resistance value (Rbase) for the first resistor (R1);
selecting a decibel (dB) step to be obtained between stages (stages 1 to k) of the attenuation circuit (65);
calculating a second resistance value (Rh) for the second resistor (R2) and the fourth resistor (R6) based on the first resistance value (Rbase) and the selected dB step;
calculating a third resistance value (Rv) for the third resistor (R5) based on the first resistance value (Rbase) and the selected dB step;
selecting a number of stages for the plurality of second stages (stages 1 to k−1); and
assembling the attenuation circuit (65) to have the first stage (stage k) connected to the selected number of second stages (stages 1 to k−1), the first stage (stage k) having the first resistor (R1) with the first resistance value (Rbase) and the second resistor (R2) with the second resistance value (Rh), each second stage of the plurality of second stages (stages 1 to k−1) having the third resistor (R5) with the third resistance value (Rv) and the fourth resistor (R6) with the second resistance value (Rh).

8. The method of claim 7, wherein the assembling the attenuation circuit includes connecting the first stage and the selected number of second stages in a ladder network.

9. The method of claim 7, wherein the assembling the attenuation circuit includes:
connecting the first resistor and the second resistor of the first stage in an L configuration; and
connecting the third resistor and the fourth resistor of each second stage of the selected number of second stages in an L configuration.

10. The method of claim 9, wherein the connecting the third resistor and the fourth resistor includes connecting the third resistor in parallel to the first resistor.

11. The method of claim 7, wherein the assembling the attenuation circuit includes:
providing a plurality of taps;
connecting the first resistor and the second resistor of the first stage to a tap of the plurality of taps; and
connecting the third resistor and the fourth resistor of each second stage of the selected number of second stages to a respective tap of the plurality of taps.

12. The method of claim 11, wherein the assembling the attenuation circuit includes connecting each tap of the plurality of taps to a corresponding connection point of a plurality of connection points on a switch, the switch being configured to permit a selection of a connection point of the plurality of connection points to provide a connection between a corresponding tap of the plurality of taps connected to the selected connection point and another device connected to the switch.

13. An amplifier module (63) comprising:
an operational amplifier (92), the operational amplifier (92) having a first input configured to be connected to a voltage source (112);
an attenuation circuit (65) connected to an output of the operational amplifier (92), the attenuation circuit (65) comprising:
a first stage (stage k) comprising a first resistor (R1) connected to a second resistor (R2), the first resistor (R1) having a first resistance value (Rbase) and the second resistor (R2) having a second resistance value (Rh);
a plurality of second stages (stages 1 to k−1) connected to the first stage (stage k), each second stage of the plurality of second stages (stages 1 to k−1) comprising a third resistor (R5) connected to a fourth resistor (R6), wherein the third resistor (R5) has a third resistance value (Rv) and the fourth resistor (R6) has a fourth resistance value (Rh) equal to the second resistance value (Rh), wherein one second stage (stage 1) of the plurality of second stages (stages 1 to k−1) being connected to the output of the operational amplifier (92);
a plurality of taps ($V_0$-$V_7$), each tap of the plurality of taps ($V_0$-$V_7$) corresponding to a voltage step for the attenuation circuit (65); and
wherein the first resistance value (Rbase), the second resistance value (Rh) and the third resistance value (Rv) are selected to provide a predetermined decibel (dB) step between the plurality of taps ($V_0$-$V_7$); and
a switch (110) connected between the attenuation circuit (65) and a second input of the operational amplifier (92), the switch (110) having a plurality of connection points (s1-s8), each connection point of the plurality of connection points (s1-s8) being connected to a corresponding tap of the plurality of taps ($V_0$-$V_7$), wherein the switch (110) is configured to provide a connection between a selected connection point of the plurality of connection points (s1-s8) and the second input of the operational amplifier (92).

14. The amplifier module of claim 13, wherein third resistance value is different from the first resistance value and the second resistance value, and the second resistance value is different from the first resistance value.

15. The amplifier module of claim 13, wherein the first stage and the plurality of second stages are connected in a ladder network.

16. The amplifier module of claim 13, wherein the first resistor and the second resistor are connected to a tap of the plurality of taps and the third resistor and the fourth resistor of each second stage of the plurality of second stages are connected to a tap of the plurality of taps.

17. The amplifier module of claim 16, wherein the second resistor is connected to the corresponding tap of a second stage of the plurality of second stages.

18. The amplifier module of claim 13, wherein the third resistor of each second stage of the plurality of second stages is connected in parallel to the first resistor.

19. The amplifier module of claim 13, wherein the first resistor and the second resistor of the first stage are connected in an L configuration and the third resistor and the fourth resistor of each second stage of the plurality of second stages are connected in an L configuration.

20. The amplifier module of claim 13, wherein the second input of the operational amplifier is an inverting input of the operational amplifier.

21. The amplifier module of claim 13, wherein the second resistance value (Rh) is based on the first resistance value (Rbase) and the predetermined decibel (dB) step and the third resistance value (Rv) is based on the first resistance value (Rbase) and the predetermined decibel (dB) step.

22. The amplifier module of claim 21, wherein the second resistance value (Rh) is selected according to the equation: $Rh=Rbase*(10^{(dBL/20)}-1)$, where dBL is the predetermined dB step.

23. The amplifier module of claim 22, wherein the third resistance value (Rv) is selected according to the equation: $Rv=Rbase*(1+(1/(10^{(dBL/20)}-1)))$.

24. The attenuation circuit of claim 2, wherein the second resistance value (Rh) is based on the first resistance value (Rbase) and the equal decibel (dB) step and the third resistance value (Rv) is based on the first resistance value (Rbase) and the equal decibel (dB) step.

25. The attenuation circuit of claim 24, wherein the second resistance value (Rh) is selected according to the equation: $Rh=Rbase*(10^{(dBL/20)}-1)$, wherein dBL is the equal dB step.

26. The attenuation circuit of claim 25, wherein the third resistance value (Rv) is selected according to the equation: $Rv=Rbase*(1+(1/(10^{(dBL/20)}-1)))$.

27. The method of claim 7, wherein the calculating the second resistance value (Rh) includes determining the second resistance value (Rh) according to the equation: $Rh=Rbase*(10^{(dBL/20)}-1)$, where dBL is the selected dB step.

28. The method of claim 27, wherein the calculating the third resistance value (Rv) includes determining the third resistance value (Rv) according to the equation: $Rv=Rbase*(1+(1/(10^{(dBL/20)}-1)))$.

* * * * *